(12) United States Patent
Kulkarni et al.

(10) Patent No.: US 8,356,138 B1
(45) Date of Patent: Jan. 15, 2013

(54) METHODS FOR IMPLEMENTING PROGRAMMABLE MEMORY CONTROLLER FOR DISTRIBUTED DRAM SYSTEM-IN-PACKAGE (SIP)

(75) Inventors: Chidamber R. Kulkarni, Santa Clara, CA (US); Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1023 days.

(21) Appl. No.: 11/894,346

(22) Filed: Aug. 20, 2007

(51) Int. Cl.
*G06F 12/00* (2006.01)
(52) U.S. Cl. ........................................ 711/105
(58) Field of Classification Search .................. None
See application file for complete search history.

(56) References Cited

U.S. PATENT DOCUMENTS

| | | | |
|---|---|---|---|
| 5,134,695 A * | 7/1992 | Ikeda | 711/5 |
| 5,301,278 A * | 4/1994 | Bowater et al. | 711/5 |
| 7,068,072 B2 | 6/2006 | New et al. | |
| 2004/0199741 A1 * | 10/2004 | Floman | 711/170 |
| 2004/0268286 A1 * | 12/2004 | New et al. | 716/14 |
| 2006/0155938 A1 * | 7/2006 | Cummings et al. | 711/149 |

* cited by examiner

*Primary Examiner* — Brian Peugh
(74) *Attorney, Agent, or Firm* — Thomas A. Ward; Kevin T. Cuenot

(57) ABSTRACT

A multi-port memory controller (MPMC) can be parameterized to selectively connect to different memory configurations. In particular, a programmable device that is combined with a DRAM in a die-stacked distributed memory in a single chip is provided with the programmable device forming the MPMC. The programmable device is parameterized to form a memory controller that can either aggregate or segment memory controller components to control different DRAM memory banks either together or separately. The aggregation or segmentation of the memory devices can be configured dynamically during operation of the programmable device.

20 Claims, 8 Drawing Sheets

METHODS FOR IMPLEMENTING PROGRAMMABLE MEMORY CONTROLLER FOR DISTRIBUTED DRAM SYSTEM-IN-PACKAGE (SIP)

BACKGROUND

1. Technical Field

Embodiments of the present invention relate to features of a Field Programmable Gate Array (FPGA) to enable the FPGA to be used as a memory controller. More particularly, the present invention relates to a memory controller that can be used in a stacked-die configuration to control one or more DRAM memory devices.

2. Related Art

Conventional processor-based systems use some form of memory controller in order to access memory devices and provide arbitration for devices connected to the memory controller ports such as processors or other peripherals. To address the need to configure a memory controller to provide maximum bandwidth when used with various processor systems, a programmable logic device such as a Field Programmable Gate Array (FPGA) has been used to create the memory controller. FPGAs can be used to provide a wide variety of these memory controllers, including single port and multiport memory controllers.

FIG. 1 is a block diagram showing components of a typical FPGA 102 that can be connected to a memory 150 for purposes of illustration. The memory 150 can be a Dynamic Random Access Memory (DRAM) device. The memory 150 can further be an FPGA using die stacking as illustrated in FIG. 2. For die stacking an FPGA, die 102 is stacked with the DRAM die 150 and can be interconnected with methods such as vias, or simply wire bonding. The stacked dies 102 and 150 can then be included in a single chip package to form a single system-level integrated circuit (referred to as a "system-in-a-package" or (SiP). The concept of die-stacking an FPGA with another DRAM is described in U.S. Pat. No. 7,068,072, entitled "Integrated Circuit with Interface Tile for Coupling to a Stacked-Die Second Integrated Circuit.".

The FPGA 102 illustratively includes programmable or configurable logic circuits or "blocks," shown as CLBs 104, IOBs 106, and programmable interconnects 108, as well as configuration memory 116 for determining the functionality of the FPGA 102. The FPGA 102 may also include an embedded processor block 114, as well as various other dedicated circuitry such as blocks of random access memory ("BRAM 110"), and digital clock management (DCM) blocks 112. Those skilled in the art will appreciate that the FPGA 102 may include other types of logic blocks and circuits in addition to those described herein.

The IOBs 106, the CLBs 104, and the programmable interconnect 108 may be configured to perform a variety of functions. Notably, the CLBs 104 are programmably connectable to each other, and to the IOBs 106, via the programmable interconnect 108. Each CLB slice in turn includes various circuits, such as flip-flops, function generators (e.g., look-up tables (LUTs)), logic gates, and memory. The IOBs 106 are configured to provide input to, and receive output from, the CLBs 104. Configuration information for the CLBs 104, the IOBs 106, and the programmable interconnect 108 is stored in the configuration memory 116. The configuration memory 116 may include static random access memory (SRAM) cells. The IOBs 106 can include transceiver circuitry configured for communication over any of a variety of media, such as wired, wireless, and photonic, whether analog or digital. The DCM blocks 112 provide well-known clock management circuits for managing clock signals within the FPGA 102, such as delay lock loop (DLL) circuits and multiply/divide/de-skew clock circuits. The processor block 114 comprises a microprocessor core, as well as associated control logic.

To enable high data-rate communications, the FPGA can be configured as a multi-port memory controller (MPMC) with built-in arbitration logic as illustrated in FIG. 3. The MPMC may include any number of ports, each of which may be configured to interface with any type of device such as a processor or devices connected to a system bus. The memory controller of FIG. 3 includes general ports $222_0$ through $222_N$ (collectively referred to as ports 222). The memory controller further includes port arbitration logic 306, data path logic 308, address path logic 310, and control logic 312. Internal data path interfaces of the ports 222 are respectively coupled through a data bus interface 315 to the data path 308 within the MPMC 204. The data path logic 308 includes an interface coupled through a physical (PHY) layer 206 to the memory 208. The address path logic 310 includes an input interface coupled to the address bus 318 and a memory interface coupled through the memory 208 through PHY layer 206. The port arbitration logic 306 includes an interface coupled to the control bus, 319, an interface coupled to the control logic 312, an interface coupled to the data path logic 308, and an interface coupled to the address path logic 310. The control logic 312 includes a memory interface coupled to the memory 208 through a physical (PHY) interface 206.

In operation, the port arbitration logic 306 executes an arbitration algorithm to select one of the ports 222 for access to the memory 208. Notably, a plurality of the ports 222 may provide memory transaction requests to the port arbitration logic 306 simultaneously. The port arbitration logic 306 analyzes all pending transaction requests and provides a request acknowledgment to one of the ports 222 in accordance with the arbitration algorithm. The one of the ports 222 that "wins" then obtains access to the memory 208 and the requested memory transaction is performed. The port arbitration logic 306 provides port select data to each of the address path logic 310 and the data path logic 308. The port select data includes the identity of the selected one of the ports 222. The address path logic 310 receives an address from the selected one of the ports 222 using the port select data. Likewise, the data path logic 308 receives data from the selected one of the ports 222 using the port select data.

After granting a transaction request from one of the ports 222, the port arbitration logic 306 provides a memory transaction request to the control logic 312. The control logic 312 processes the memory transaction request and determines a sequence of sub-transactions required to perform the desired memory transaction. The control logic 312 then drives the data path logic 308, the address path logic 310, and the PHY interface 206 with control signals that execute memory operations on the memory 208. The end result is that the requested memory transaction selected by the arbitration logic 306 is performed.

What is needed is a method for efficiently using the components of an FPGA to form a memory controller in a stacked die arrangement. In particular, a versatile FPGA memory controller is needed that can be easily varied to be used with multiple types of die stacking arrangements.

SUMMARY

According to embodiments of the present invention, a design is provided for a flexible programmable memory controller that can be programmed into an FPGA to control die-stacked distributed memory. The FPGA memory controller can be parameterized along two different axes as described below to be versatile to control different DRAM configurations.

The memory controller can be parameterized along the two different axes as follows: (1) first, the memory controller can be configured to fit with different bit widths and various other DRAM parameters (e.g. CAS latency, Refresh, cycle, etc.) as in traditional memory controllers; and (2) second, the memory controller can allow for aggregation or segregation of components to control different memory banks together or separately. The second parameterization in particular is useful for DRAM architectural requirements using FPGA based die-stacking. End users can mix sequential and interleaved access types (across different banks), build non-uniform bank sizes, and run bank management that was previously not possible.

Embodiments of the present invention provide several key attributes for a distributed DRAM-FPGA SiP. The key attributes include: (1) each DRAM bank can be accessed independently or set to low power modes by disabling the local power supply connection; (2) there can be an assortment of different DRAM banks (e.g. of varying sizes); and (3) the delay from DRAM pins to FPGA registers (or fabric) is known. Thus simple signaling schemes can be used instead of source synchronous mechanisms employed currently.

BRIEF DESCRIPTION OF THE DRAWINGS

Further details of the present invention are explained with the help of the attached drawings in which.

DETAILED DESCRIPTION

Embodiments of the present invention present a memory controller that can be used in a stacked die relationship with a DRAM memory. The memory controller will be described for use with respect to an FPGA, although it is understood that the embodiments can be utilized with various types of FPGAs, or with other types of programmable logic than an FPGA. Further, although the memories are described with respect to DRAM, it is understood that embodiments of the present invention may be used with other types of memory.

Figure 4:
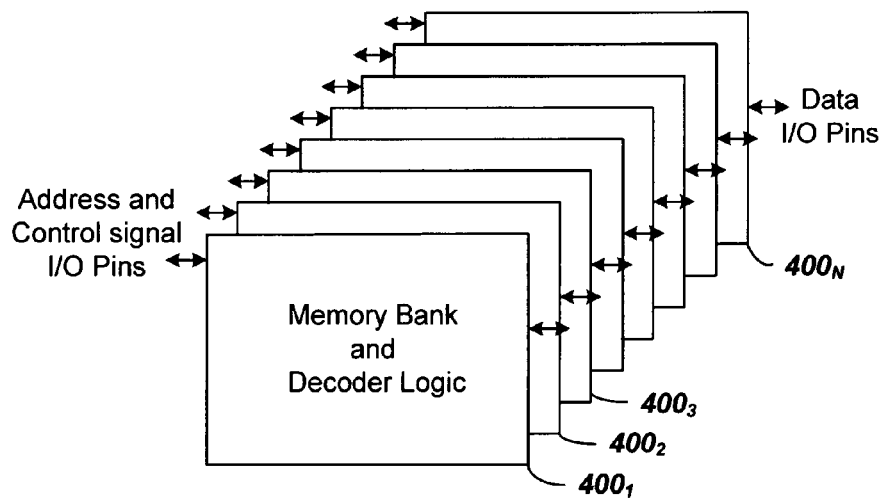
FIG. 4 illustrates one arrangement for a distributed DRAM memory where a separate memory controller is used for each DRAM on a die in a segmented manner, in accordance with an embodiment of the present invention.

FIG. 4 illustrates one arrangement of a distributed DRAM memory with decoder logic set to individually control access to each of the individual memory banks $400_1$-$400_N$, in accordance with one embodiment of the present invention. In other words, each of the memory banks $400_1$-$400_N$ has its own decoder logic. In operation, the decoder logic of each of the memories receives address and control signals from one or more memory controllers and accesses appropriate rows and columns of locations in individual memories $400_1$-$400_N$. Data can then be read from or written from the memories in the addressed locations.

Figure 5:
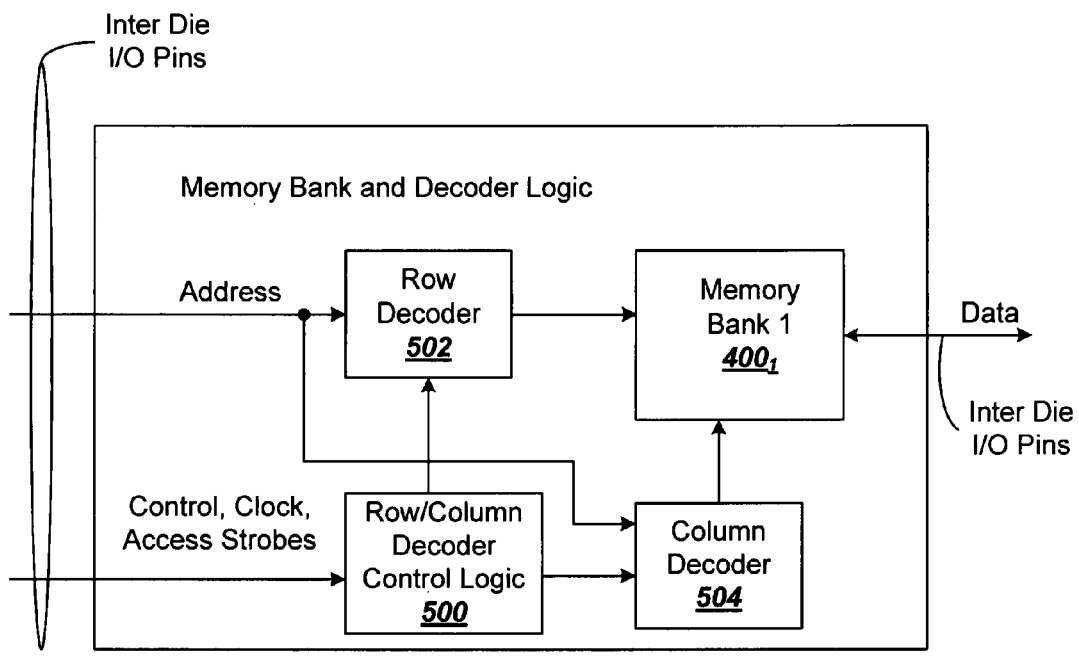
FIG. 5 is a block diagram illustrating components used to control a single DRAM memory bank device, in accordance with an embodiment of the present invention.

FIG. 5 is a block diagram illustrating individual components of one of the memory banks $400_1$-$400_N$ of FIG. 4. The decoder logic is made up of a row and column decoder control logic 500, row decoder 502 and column decoder 504 as used to control a single DRAM memory device $400_1$. The row decoder 502 and column decoder 504 receive an address from a memory controller and access a location in the memory device $400_1$ according to the address. The row and column decoder control logic 500 receives clock and access strobe signals, such as the row access and column access strobes, and serve to control operation of the row and column decoder logic.

Figure 6:
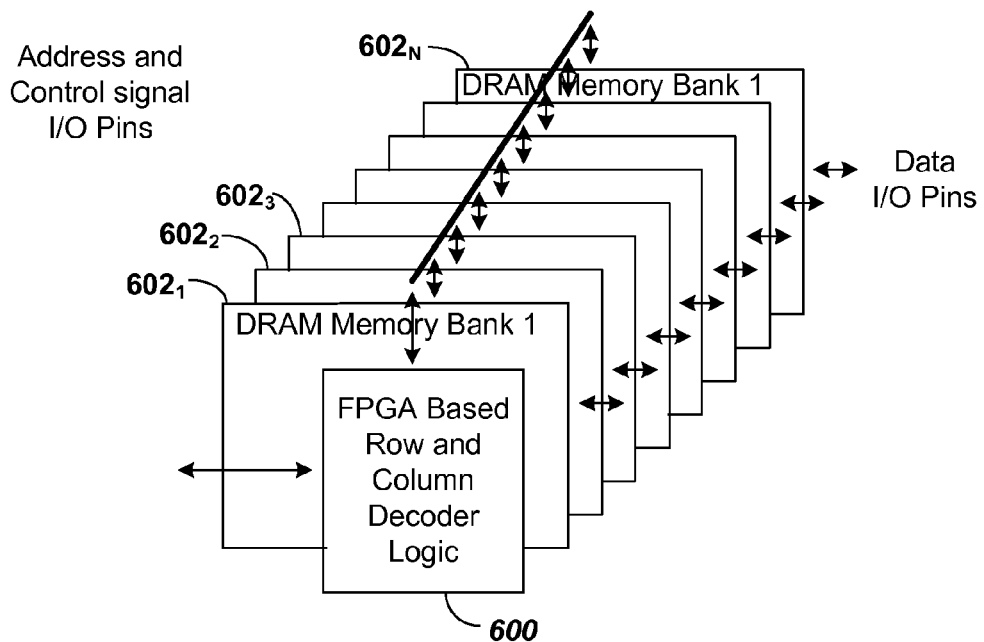
FIG. 6 illustrates another arrangement for a distributed DRAM memory where a common memory controller is used to communicate with all of the DRAM devices on a die in an aggregated manner, in accordance with an embodiment of the present invention.

FIG. 6 illustrates another arrangement of a distributed DRAM memory $600_1$-$600_N$ with a common row and column decoder logic 600 used to communicate with all of the DRAM memory banks $602_1$-$602_N$ provided on a die in an aggregated manner. In operation, the address is provided from a memory controller to the row and column decoder logic 600 to access a memory location in one of the memory banks $600_1$-$600_N$. Data can then be either read or written from the addressed memory location. The row and column decoder logic 600 will include a single row decoder, column decoder and row/column control logic, similar to components 500, 502 and 504 of FIG. 5, but with the single set of components used to access all of the memory banks $600_1$-$600_N$ in the aggregate.

Figure 7:
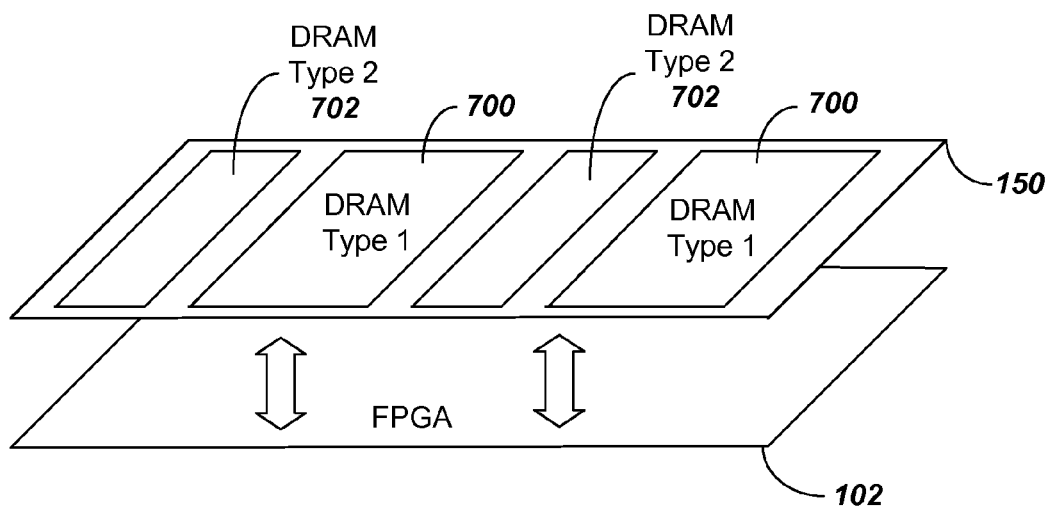
FIG. 7 illustrates an FPGA in a die-stacked arrangement with a distributed DRAM memory, in accordance with an embodiment of the present invention.

FIG. 7 illustrates an embodiment of an FPGA die-stacked arrangement with a distributed DRAM memory that can be accessed by either the segmented arrangement of FIG. 4 or the aggregated arrangement of FIG. 6. As shown, the FPGA is provided on one die 102, while DRAM memory is provided on a second die 150 stacked with the first 102. As illustrated, the DRAM memory die 150 can include more than one type of memory on the single die, a first type 700 and a second type 702. With the DRAM memory 150 shown, it may be beneficial for a designer to aggregate the memories 700 together using the configuration of FIG. 6. Further, it may be beneficial to aggregate the memories 702 together, while keeping the aggregated memories 700 and 702 segmented as illustrated in FIG. 4. With different distributed DRAM arrangements, different aggregated or segmented memory configurations may be desirable. According to embodiments of the present invention, therefore, an FPGA configuration is provided to enable such aggregation or segmentation depending on the desired memory systems to operate in the most efficient manner while minimizing use of FPGA resources.

Figure 1:
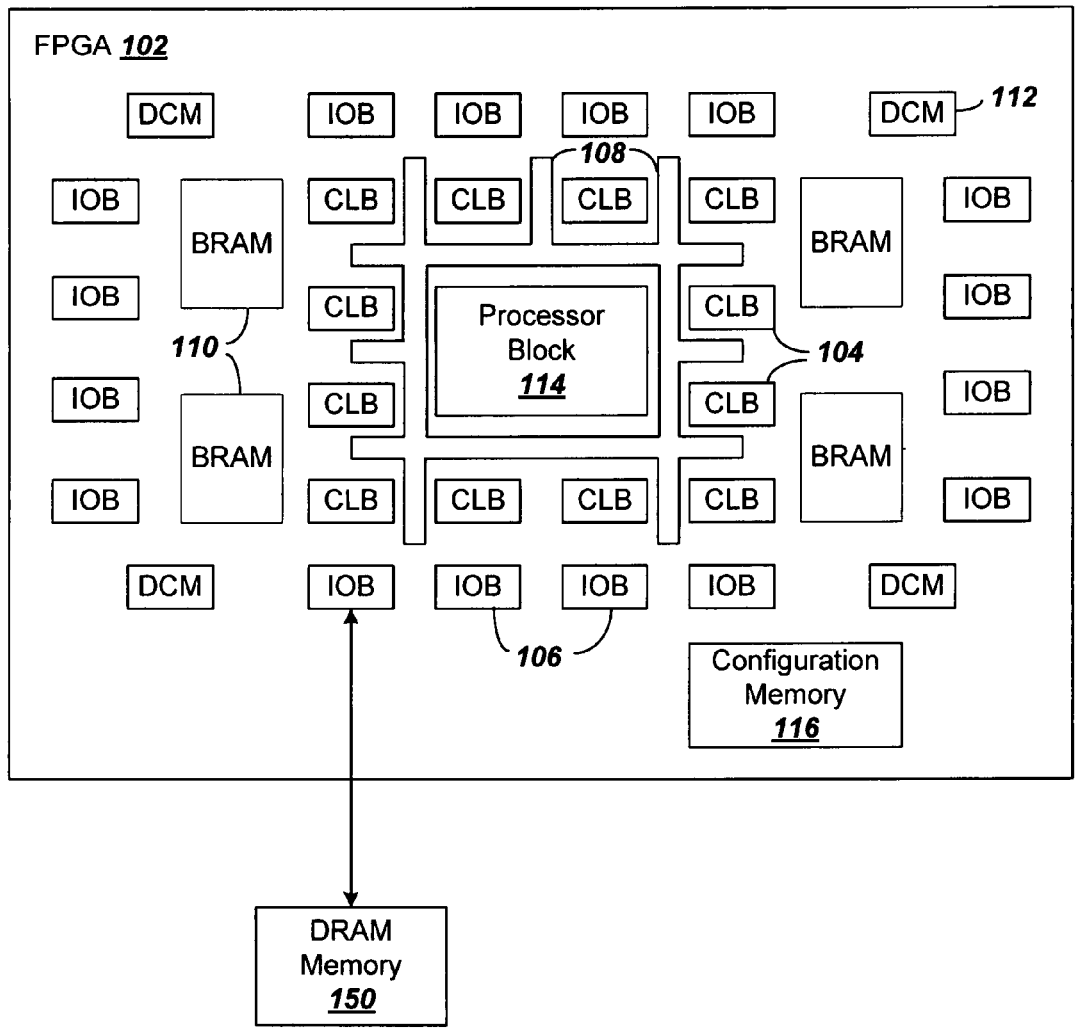
FIG. 1 is a block diagram depicting an exemplary embodiment of components of an FPGA as connected to a memory device.
Figure 2:
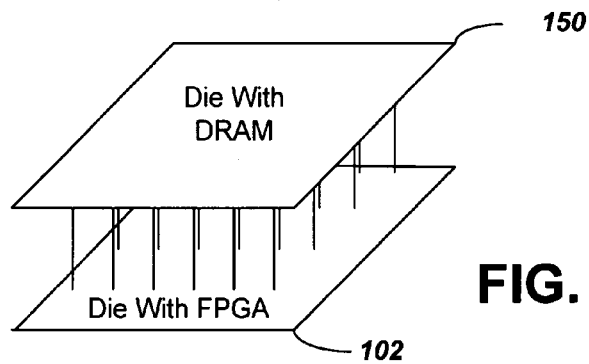
FIG. 2 illustrates how an exemplary FPGA can be die-stacked with a DRAM memory.
Figure 3:
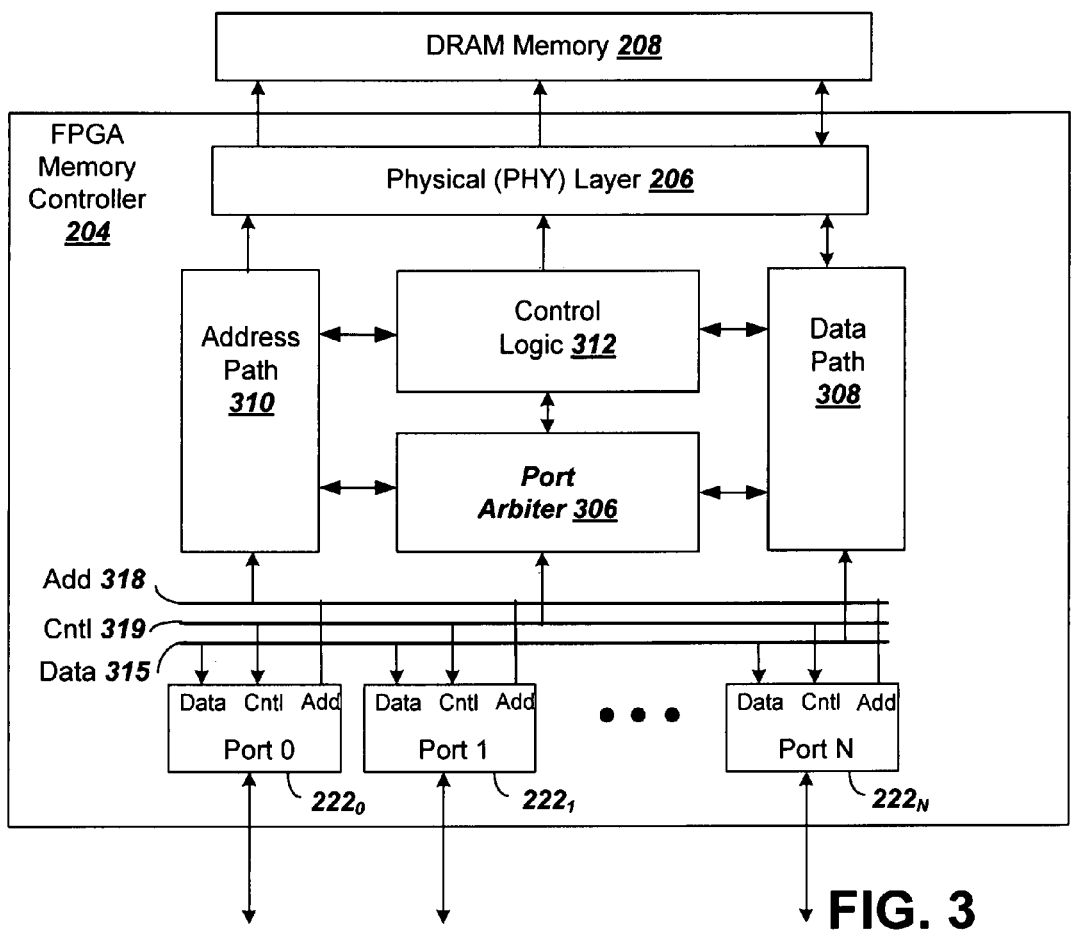
FIG. 3 is a block diagram depicting components of an FPGA configured as a multi-port memory controller.
Figure 8:
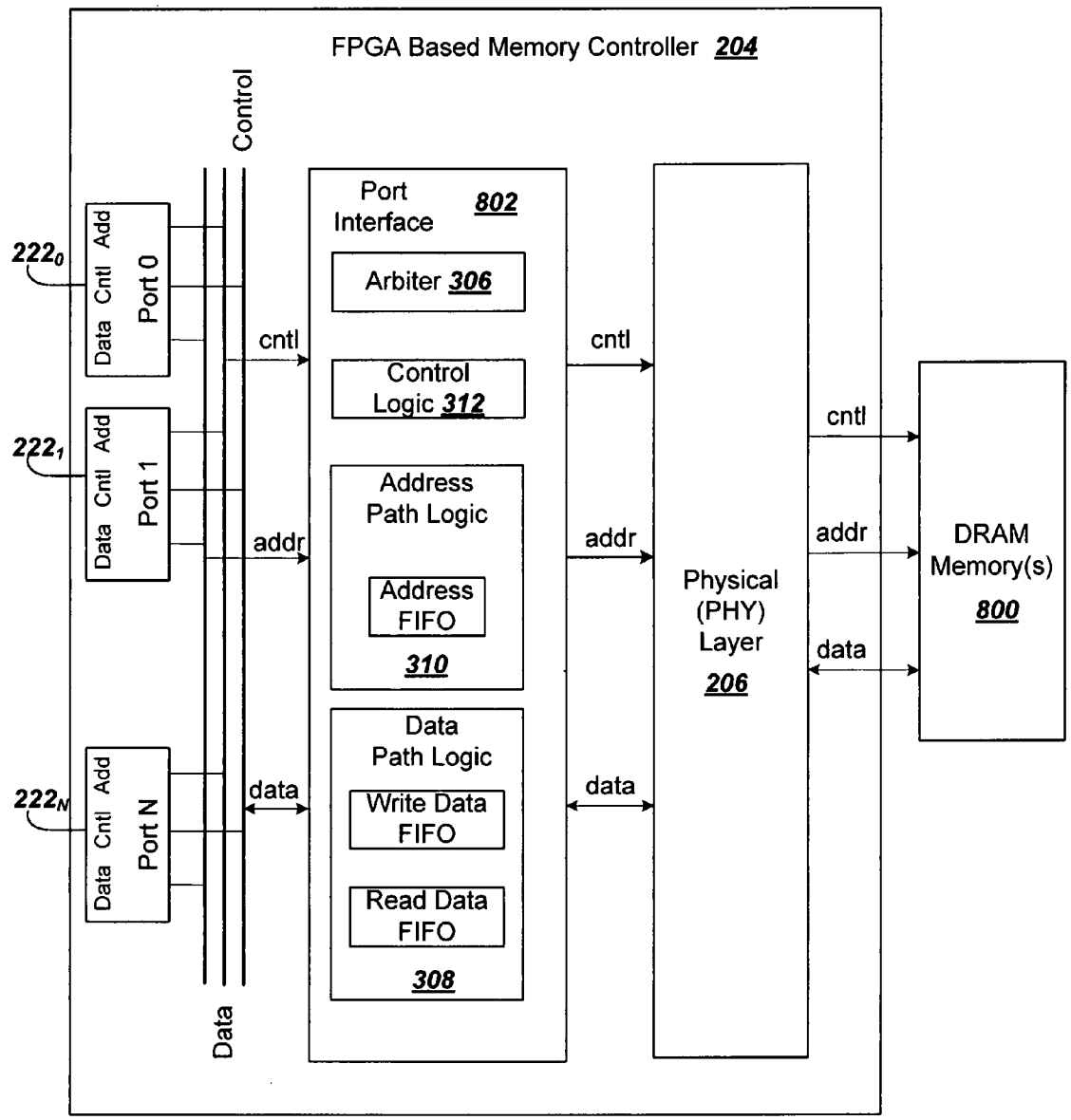
FIG. 8 is a block diagram of an FPGA configured as a conventional memory controller that can be connected to one or multiple DRAM memory devices, in accordance with an embodiment of the present invention.

FIG. 8 is a block diagram of an FPGA configured as a conventional memory controller 204 that can be connected to control one or more DRAM memories 800. The components of the memory controller 204 include components described with respect to FIG. 3. A combined port interface unit 802 illustrated in FIG. 3 is defined to include the arbiter 306, control logic 312, address path logic 310 and data path logic 308. The PHY layer 206 enables optionally interfacing with one or multiple DRAM memory devices 800.

The PHY layer 206 interfaces with the data and data strobe signals of DRAM 800. In the traditional memory controller a significant area is used by the PHY layer 206 since it needs to support complex signaling schemes between different types of DRAM and the FPGA. For example, source synchronous signaling may require complex calibration circuits that are provided in the PHY layer. In die-stacking applications, the inter-die connections have known delay and hence the PHY layer can be very simple. In fact, the existing DDR registers in the FPGA IOBs can be used to register data on both the edges of a clock if required, thus reducing the complexity of components required for the PHY layer 206.

Figure 9:
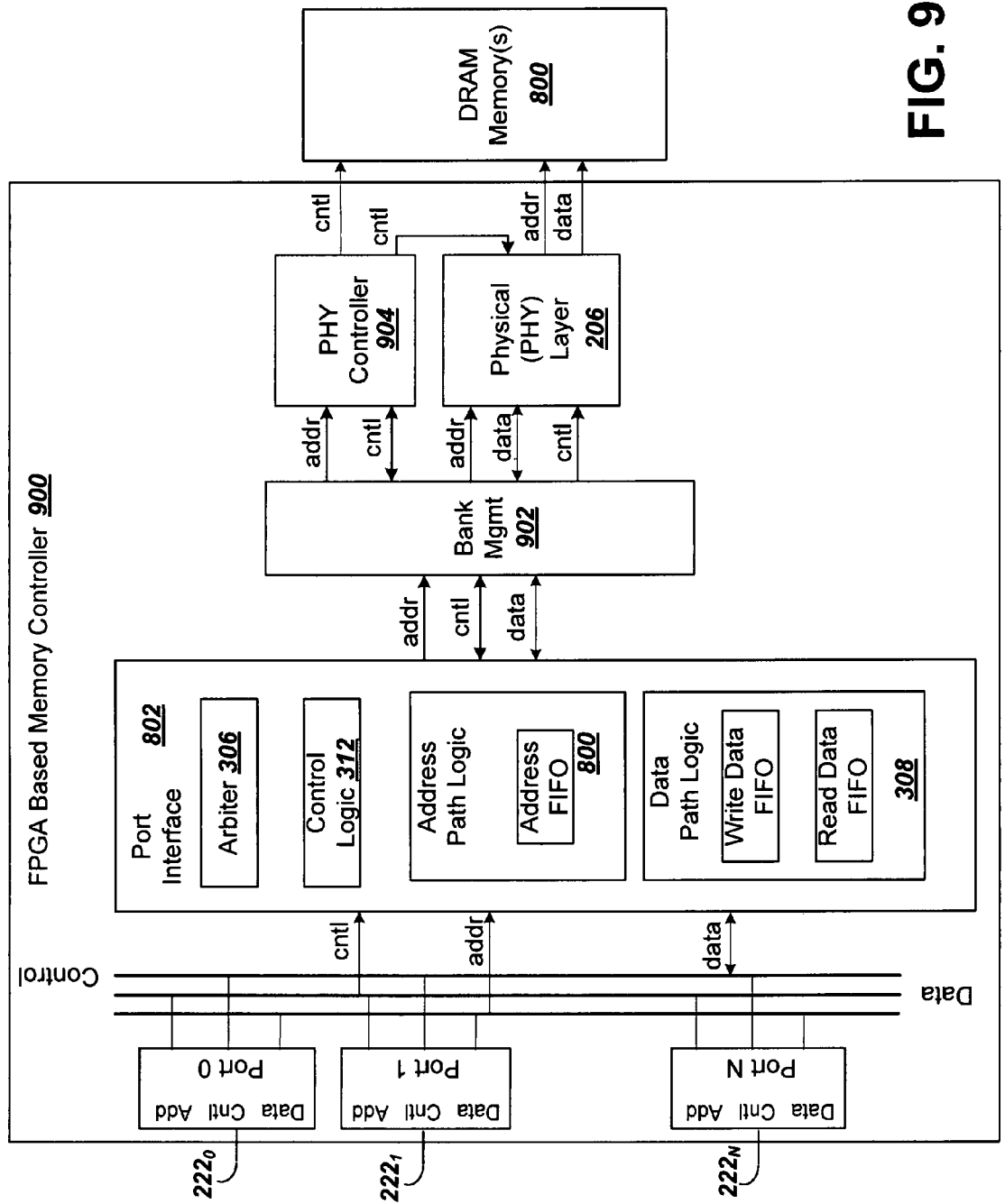
FIG. 9 provides a block diagram of a memory controller in accordance with embodiments of the present invention with a bank management unit that allows one or more memory devices to be alternatively separately operated by an FPGA memory controller, or to be aggregated to operate together, in accordance with an embodiment of the present invention.

FIG. 9 provides a block diagram of a memory controller in accordance with embodiments of the present invention. The memory controller includes a bank management module 902 that provides an interface between the port interface 802 and the PHY interface 206. The bank management module 902 allows one or more port interfaces 802 to be selectively aggregated together to control multiple memory devices 800, or alternatively to be segregated so that separate port interfaces 802 can separately control one or more memory devices 800. To facilitate control between separate PHY interfaces 206 that can be integrated together, PHY controller logic 904 is further used in combination with the bank management module 902. The PHY controller 904 includes logic to provide control signals to one or more PHY interfaces 206 and integration of address and data signals so that separate PHY interfaces 206 can operate together or apart as described in more detail to follow.

Features of the bank management module 902 include: (1) a programmable logic that allows control for a number of memory banks to be aggregated to form a larger memory bank. These larger memory bank sizes can be non-uniform and are not limited to powers of 2 as in conventional DRAMs; (2) the ability to segment or separate one or more memory banks to be accessed independently at run-time; and (3) the ability to program either statically or dynamically whether the access mode over multiple DRAM banks is sequential or interleaved. The sequential or interleaved feature requires hundreds of cycles in conventional DRAM due to loading mode registers and changing the DRAM set-up. In a die-stacking application, since all the relevant data/data strobe pins (or vias) for each bank are exposed to the FPGA and there is bank management logic, the memory controller can perform data management to these pins (vias, etc.) with very little overhead at the order of few cycles (<10 cycles) without attempting to change the DRAM set-up via mode registers.

The above three attributes are key to closing the gap between application characteristics and DRAM access modes further than is possible with conventional DRAM memory and their controllers. The bank management module 902 illustrates how users can dynamically select different banks to be aggregated or segmented in FIGS. 10-13 to follow. In particular, users can decide to use a particular access mode while in aggregation mode (e.g. interleaved mode) and a different access mode such as segmentation (e.g. sequential mode) at a later time. There are two different approaches to design and implement the above-described bank management features.

Figure 10:
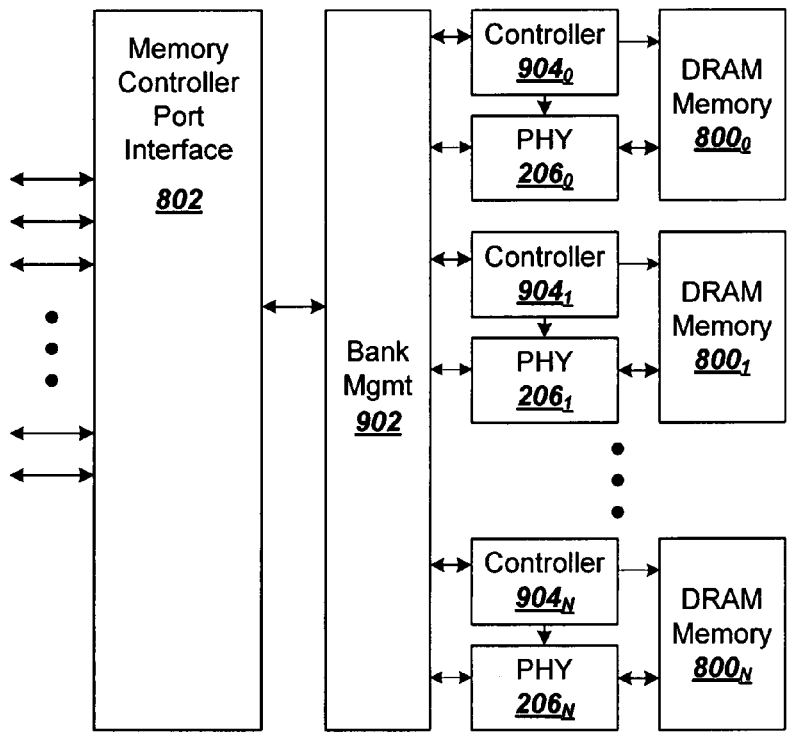
FIG. 10 illustrates an aggregated memory with a single memory controller used to control multiple aggregated DRAM memory devices, in accordance with an embodiment of the present invention.

FIG. 10 illustrates an aggregated memory with a centralized memory controller port interface 802 used to control multiple aggregated DRAM memory devices $800_0$-$800_N$, in accordance with an embodiment of the present invention. The centralized control model is desirable for applications where sharing the core DRAM controller components, namely the port interface logic 802, between different memory banks $800_0$-$800_N$ is useful. Such applications are typically those involving multiple processors connected to ports of the FPGA configured as a memory controller, since these processors will require synchronization across different DRAM banks. The memory controller can operate at a higher frequency, while the processors can operate at a lower frequency in an efficient manner in a centralized or aggregated configuration.

Figure 12:
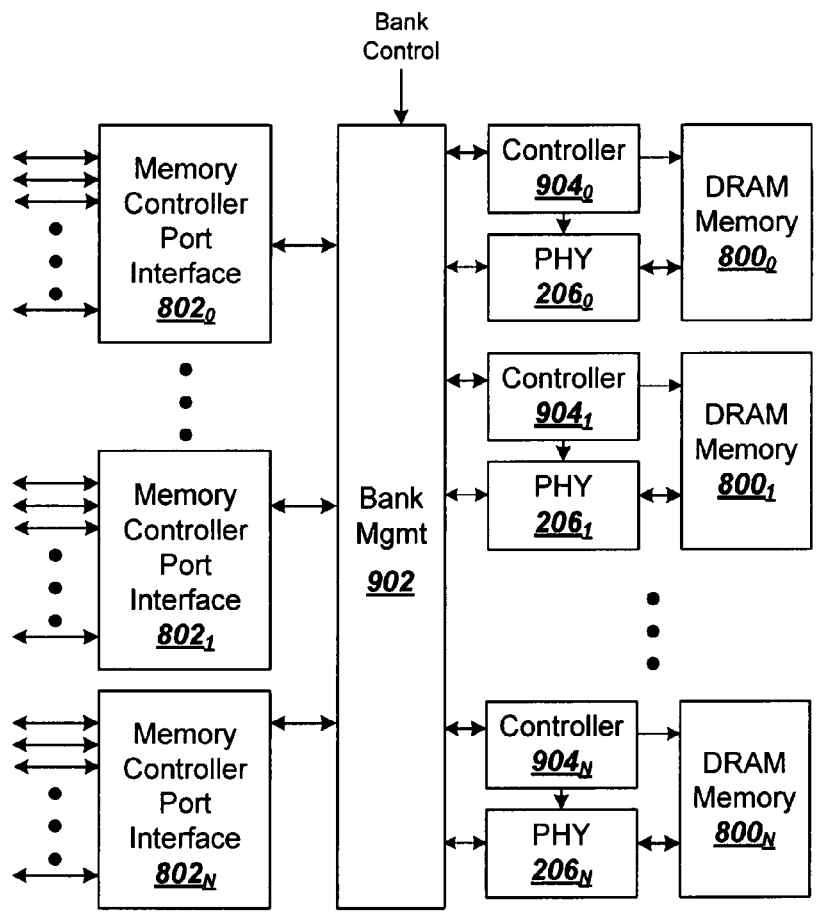
FIG. 12 illustrates a segregated memory with bank management units set so that multiple memory controllers control individual memory devices in a segregated manner, in accordance with an embodiment of the present invention.

In FIG. 10, the bank management module 902 operates to separate the address, data and control signals from the port interface 802 into the separate PHY layers $206_0$-$206_N$. The PHY controllers $904_0$-$904_N$ distribute the signals from the port interface 802 to the appropriate PHY device. With the bank management module 902, sharing of resources for a controller is configurable, such as that shown with a central port interface 802 supplying multiple memories, or with separated port interfaces as shown in FIG. 12. Namely, the port interface 802 can service one or more banks depending upon factors such as interleaving of accesses, need for wider memory, etc. Change between centralized port interface 802 and separate port interfaces as shown in FIG. 12 can be done upon initial programming of the FPGA, or dynamically during operation of the FPGA.

Figure 11:
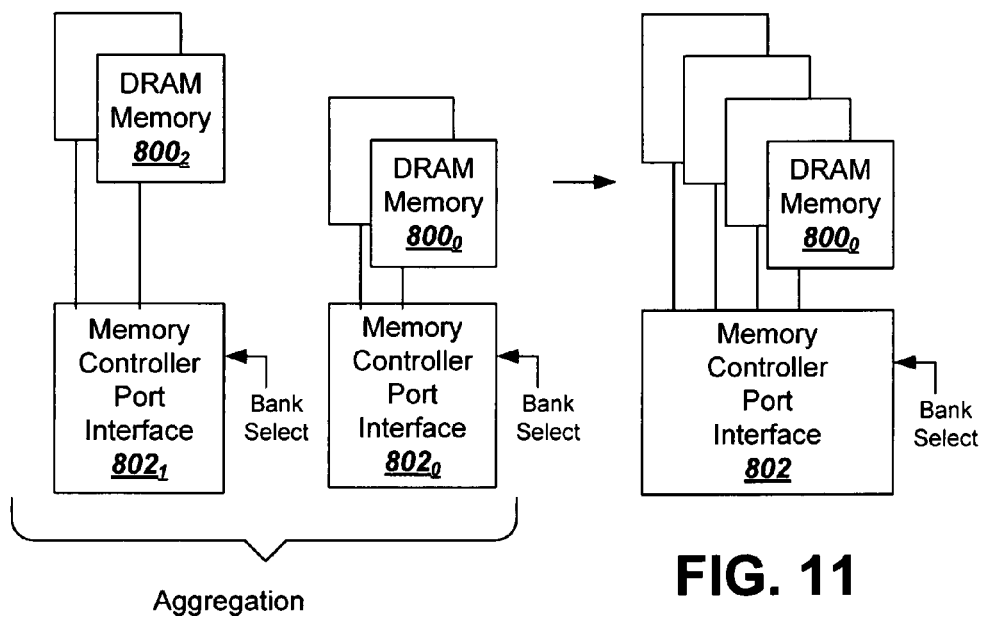
FIG. 11 is a block diagram illustrating aggregation of separate memory systems to form the system of FIG. 10, in accordance with an embodiment of the present invention.

FIG. 11 is a block diagram illustrating aggregation of separate memory systems to form the system of FIG. 10. As illustrated generally, the memory devices $800_0$-$800_1$ that are separately connected to one or more individual port interface devices $802_0$-$802_1$ are aggregated so that all of the memory devices $800_0$-$800_N$ are controlled together by a single port interface 802.

Figure 13:
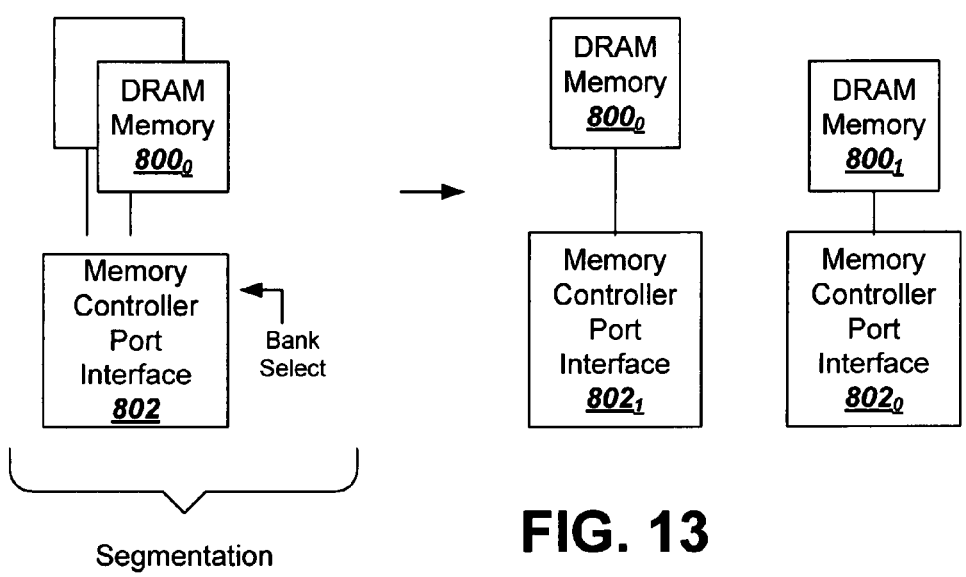
FIG. 13 is a block diagram illustrating segregation of aggregated memory devices to form the system of FIG. 12, in accordance with an embodiment of the present invention.

FIG. 12 illustrates a distributed memory with the bank management unit 902 set so that multiple memory controller port interfaces $802_0$-$802_N$ control individual memory banks $800_0$-$800_N$ in a segregated manner. To distribute the memory system from an aggregated form, as illustrated in FIG. 13, a user can partition the memory banks $800_0$-$800_N$ and controller logic $802_0$-$802_N$ into regions that do not require random access across various banks $800_0$-$800_N$. This type of memory control system is particularly suited to a pipelined implementation with no arbitrary feedbacks or other inter-stage dependencies. Given the configurability of the FPGA fabric, either of the centralized system as shown in FIGS. 10-11 or a distributed memory arrangement as shown in FIGS. 12-13 can be implemented in soft logic. Hardening only the controllers $904_0$-$904_N$ and PHY layers $206_0$-$206_N$ for each DRAM bank is practical, while the bank logic can be implemented in soft logic.

Although the present invention has been described above with particularity, this was merely to teach one of ordinary skill in the art how to make and use the invention. Many additional modifications will fall within the scope of the invention, as that scope is defined by the following claims.

What is claimed is:

1. A memory controller system for providing access from connection ports to one or more memory devices comprising:
   a plurality of controller interface devices, each comprising:
      an address device for receiving addresses from one or more of the ports and for providing data to outputs of the controller interface,
      a data device for receiving data from one or more of the ports and for providing the data to outputs of the controller interface, and
      a control device for receiving control signals from one or more of the ports and providing control signals to outputs to the controller interface;
   a plurality of physical interfaces for receiving the control, the address and the data signals from the outputs of the plurality of controller interface devices and providing the received control and data signals to the memory devices; and
   a bank management interface for connecting the plurality of controller interfaces to the plurality of physical interfaces, the bank management interface being programmable to selectively implement one of a plurality of modes comprising a first mode and a second mode, wherein,
   the first mode aggregates the plurality of controller interface devices into an aggregated controller interface device and wherein the bank management interface is configured to provide the aggregated controller interface device with access to each of the plurality of physical interfaces, and
   the second mode segments the plurality of controller interface devices among a plurality of regions and the plurality of physical interfaces among the plurality of regions and wherein the bank management interface is configured to provide controller interface devices with access only to physical interfaces that are within the same region.

2. The memory controller system of claim 1, wherein the system is provided in a field programmable gate array (FPGA).

3. The memory controller system of claim 2, wherein the FPGA is provided on a first die stacked wherein the one or more memory devices are implemented in a second die, stacked with the first stacked die.

4. The memory controller system of claim 3, wherein the first die and the second die are provided in a single integrated circuit chip.

5. The memory controller system of claim 4, wherein the one or more memory devices are distributed DRAM memory devices with multiple ones of the DRAM memory devices provided on the single integrated circuit chip.

6. The memory controller system of claim 1, further comprising:
   one or more physical control devices for receiving control and address signals from the bank management unit and for providing control signals to the plurality of the physical interfaces to correspond with the selective aggregation or segmentation of the controller interfaces of the bank management interface.

7. The memory controller system of claim 1, wherein the bank management interface is dynamically programmable to perform the selective aggregation or segmentation during operation.

8. The memory controller system of claim 1, wherein:
   the plurality of controller interface devices are configured to receive requests for accessing memory devices and are not coupled directly to memory devices; and
   the plurality of physical interfaces are configured to couple to the memory devices.

9. The memory controller system of claim 1, wherein the first mode aggregates the plurality of controller interface devices into an aggregated controller interface device by connecting the plurality of controller interface devices to a single physical interface.

10. The memory controller system of claim 1, wherein the bank management interface is dynamically programmable during operation to implement a selected access mode comprising an interleaved mode or a sequential mode.

11. The memory controller system of claim 10, wherein implementation of a selected access mode is independent of whether the bank management interface implements the first mode that aggregates the plurality of controller interfaces or the second mode that segments the plurality of controller interfaces.

12. A non-transitory computer readable medium with instructions stored thereon for programming a memory controller to distribute signals from a plurality of ports to distributed memory devices provided on a die, the instructions comprising code to perform steps comprising:
   forming a plurality of controller interface devices for receiving data address and control signals from the ports and providing outputs for transmitting the data, address and control signals; and
   forming a bank management interface to selectively implement one of a plurality of modes comprising a first mode and a second mode, wherein,
   the first mode aggregates the plurality of controller interface devices into an aggregated controller interface device and wherein the bank management interface is configured to provide the aggregated controller interface device with access to each of a plurality of physical interfaces, and
   the second mode segments the plurality of controller interface devices among a plurality of regions and the plurality of physical interfaces among the plurality of regions and wherein the bank management interface is configured to provide controller interface devices with access only to physical interfaces that are within the same region.

13. The computer readable medium of claim 12, further comprising code to perform steps comprising:
   forming the physical interfaces for connecting the bank management interface to the individual one of the memory devices to provide data signals to and from the plurality of controller interface devices to the individual memory devices.

14. The computer readable medium of claim 13, further comprising code to perform steps comprising:
   forming a physical interface control for connecting the bank management interface to the individual one of the memory devices to receive control and address signals from the bank management interface and for providing signals for controlling the physical interfaces.

15. The computer readable medium of claim 12, wherein the memory controller is provided in a Field Programmable Gate Array (FPGA).

16. The computer readable medium of claim 12, wherein the bank management interface is dynamically programmable to switch between the first mode and the second mode during operation.

17. A method for controlling access from connection ports to distributed DRAM memories using a device with programmable resources, the method comprising:
- programming logic to provide a plurality of controller interface devices for receiving data, address and control signals from the ports and providing data, address and control signals for distributing to one or more of the DRAM memories; and
- programming the bank management interface to selectively implement one of a plurality of modes comprising a first mode and a second mode, wherein,
- the first mode aggregates the plurality of controller interface devices into an aggregated controller interface device and wherein the bank management interface is configured to provide the aggregated controller interface device with access to each of a plurality of physical interfaces, and
- the second mode segments the plurality of controller interface devices among a plurality of regions and the plurality of physical interfaces among the plurality of regions and wherein the bank management interface is configured to provide controller interface devices with access only to physical interfaces that are within the same region.

18. The method of claim 17, wherein the device with programmable resources comprises a Field Programmable Gate Array (FPGA); and
- wherein the step of programming the bank management interface is performed during operation of the FPGA.

19. The method of claim 17, further comprising programming the bank management interface to selectively connect the plurality of the controller interface devices to multiple ones of the memory devices.

20. The method of claim 17, further comprising:
- dynamically switching between the first mode and the second mode during operation of the device.

* * * * *